United States Patent
Ajmera et al.

(10) Patent No.: US 6,900,092 B2
(45) Date of Patent: May 31, 2005

(54) SURFACE ENGINEERING TO PREVENT EPI GROWTH ON GATE POLY DURING SELECTIVE EPI PROCESSING

(75) Inventors: Atul C. Ajmera, Wappingers Falls, NY (US); Dominic J. Schepis, Wappingers Falls, NY (US); Michael D. Steigerwalt, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 320 days.

(21) Appl. No.: 10/183,336

(22) Filed: Jun. 27, 2002

(65) Prior Publication Data

US 2002/0192888 A1 Dec. 19, 2002

Related U.S. Application Data

(62) Division of application No. 09/882,095, filed on Jun. 15, 2001, now Pat. No. 6,440,807.

(51) Int. Cl.[7] .................. H01L 21/8238; H01L 21/336; H01L 21/3205; H01L 21/31
(52) U.S. Cl. ....................... 438/231; 438/300; 438/592; 438/586; 438/776; 438/792
(58) Field of Search ................................ 438/653, 656, 438/643

(56) References Cited

U.S. PATENT DOCUMENTS

| | | | |
|---|---|---|---|
| 4,714,685 A | 12/1987 | Schubert | |
| 4,998,150 A | 3/1991 | Rodder et al. | |
| 5,118,639 A | * 6/1992 | Roth et al. | 438/300 |
| 5,200,352 A | * 4/1993 | Pfiester | 438/231 |
| 5,250,454 A | 10/1993 | Maszara | |
| 5,319,232 A | 6/1994 | Pfiester | |
| 5,369,049 A | 11/1994 | Acocella et al. | |
| 5,384,277 A | 1/1995 | Hsu et al. | |
| 5,869,375 A | 2/1999 | Choi et al. | |
| 6,083,798 A | 7/2000 | Lin | |
| 6,083,836 A | 7/2000 | Rodder | |
| 6,087,235 A | 7/2000 | Yu | |
| 6,100,188 A | * 8/2000 | Lu et al. | 438/653 |
| 6,156,613 A | 12/2000 | Wu | |
| 6,160,299 A | 12/2000 | Rodder | |
| 6,174,754 B1 | 1/2001 | Lee et al. | |
| 6,177,323 B1 | 1/2001 | Wu | |

* cited by examiner

*Primary Examiner*—John F. Niebling
*Assistant Examiner*—Ron Pompey
(74) *Attorney, Agent, or Firm*—Scully, Scott, Murphy & Presser; Margaret A. Pepper

(57) ABSTRACT

The present invention provides a method of formed a nitrided surface layer atop a polysilicon gate electrode that inhibits the growth of an epi silicon layer thereon. Specifically, the method of the present invention includes the steps of: forming a polysilicon layer atop a gate dielectric layer, forming a nitrided surface layer on the polysilicon layer; selectively removing portions of the nitrided surface layer and the polysilicon layer stopping on the gate dielectric layer, while leaving a patterned stack of the nitrided surface layer and the polysilicon layer on the gate dielectric layer; forming sidewall spacers on at least exposed vertical sidewalls of polysilicon layer; removing portions of the gate dielectric layer not protected by the sidewall spacers; and growing an epi silicon layer on exposed horizontal surfaces of an underlying semiconductor substrate.

17 Claims, 3 Drawing Sheets

US 6,900,092 B2

SURFACE ENGINEERING TO PREVENT EPI GROWTH ON GATE POLY DURING SELECTIVE EPI PROCESSING

RELATED APPLICATIONS

This application is a divisional application of U.S. application Ser. No. 09/882,095, filed on Jun. 15, 2001, now U.S. Pat. No. 6,440,807.

DESCRIPTION

1. Field of the Invention

The present invention relates to complementary metal oxide semiconductor (CMOS) device manufacturing, and more particularly to a method of fabricating CMOS devices having raised source/drain regions, without increased silicon growth on the gate electrode material.

2. Background of the Invention

As CMOS devices get smaller and smaller, the device performance can suffer from increased resistance of the contacts due to there smaller size, shallower junctions and scaled silicide thickness. As electrical junctions scale in depth, the depth of the metal silicide contact is often scaled such that the metallic silicide, which is formed, does not go too deep and 'spike' through or short the contact to the drain or source to the body of the device. This decreased thickness of metal silicide, however, increases the total resistance of the contact, which, in turn, can cause the performance of the device to suffer. This is true of all CMOS devices, but in particular to silicon-on-insulator (SOI) CMOS devices which have a thinner silicon region and which need to keep the contact resistance low.

To counter this effect, it has been suggested in the literature that silicon epitaxy be grown on the source and drain regions of the transistor. This additional epitaxial silicon layer can act as a sacrificial silicon layer; that is to say, it can be consumed during a subsequent reaction of the metal with the silicon during silicide formation at elevated temperatures. While this process of selective epitaxy, which grows on all exposed silicon surfaces, has been discussed in the literature for years, prior art processes also cause simultaneous growth of silicon on the polysilicon gate. While the growth of silicon on the source and drain regions is desirable, the growth of silicon on the gate electrode, i.e., polysilicon gate, is less desirable.

Growth of silicon on the gate electrode has several drawbacks. First, silicon grown on the gate electrode forms an overgrowth region over the edges of the sidewalls of the gate forming a mushroom shaped silicon ledge at the top of the gate. This growth was shown to cause dopant in the gate to diffuse into the newly grown silicon and cause a decrease in gate activation, or an increase in the gate inversion. This leads to device performance degradation. Finally, the increased growth on the gate makes it possible to form a link of conductive silicon from the gate over the spacer to the source/drain regions causing a short circuit. This is a known yield impact from selective epi.

In view of the above mentioned drawbacks with prior art selective epi processes, there is a continued need for developing a method which is capable of selectively forming epi silicon on the source/drain regions, while causing no substantial growth of epi silicon on any of the gate electrodes.

To solve the above problems, the prior art suggests forming a chemical vapor deposited (CVD) oxide or nitride on the top of the gate, prior to growth of the selective epi silicon layer. Such a prior art structure is shown, for example, in FIG. 1. Specifically, the structure shown in FIG. 1 comprises semiconductor substrate 10, patterned gate dielectric 14 formed on a surface of substrate 10, patterned polysilicon 16 formed on a portion of patterned gate dielectric 14, CVD oxide or nitride layer 18 formed atop the patterned polysilicon layer, and sidewall spacers 20 formed on vertical sidewalls of the patterned polysilicon layer and over a portion of the patterned gate dielectric.

While this prior art method does succeed in prevention of epi silicon growth on the gate, the prior art method suffers from the following drawbacks: First, is that fact that one must etch through this deposited film during the reactive-ion etching of the gate polysilicon electrode, which may effect the gate profile. Second, after the selective epi silicon layer is grown, a strip or removal of the deposited film on the gate is required. This may require a rather long wet etch since a plasma etch would also etch some of the source/drain regions. Moreover, if the film atop the gate is nitride, then a nitride wet etch could also attack the vertical gate sidewall or other exposed nitride sidewalls, or the wet may undercut the gate oxide which is present beneath the gate polysilicon, leading to defects in the device.

In view of the drawbacks associated with prior art methods, it is still desirable to provide a method which can inhibit the formation of silicon growth on the gate electrode through surface modification, while requiring only a reduced clean to allow further processing.

SUMMARY OF THE INVENTION

One object of the present invention is to provide a method of reducing the contact resistance in a CMOS device that is formed on a bulk semiconductor substrate or a silicon-on-insulator (SOI) substrate.

Another object of the present invention is to provide a method of forming a CMOS device having raised source/drain regions and without increased silicon growth on the gate electrode.

A yet further object of the present invention is to provide a method of inhibiting the formation of silicon growth on the gate electrode through surface modification, while requiring only a reduced clean to allow further processing.

An even further object of the present invention is to provide a method of forming a CMOS device which includes a step of forming a film on the gate electrode prior to epi silicon growth, wherein the film substantially inhibits the epi silicon growth on the gate without affecting the source/drain regions.

A still further object of the present invention is to provide a method of forming a CMOS device which includes a step of modifying at least the top horizontal surface of the gate polysilicon prior to epi growth, wherein the modified surface of the gate polysilicon substantially inhibits the epi silicon growth without affecting the source/drain regions.

These and other objects and advantages are achieved in the present invention by forming a nitrided surface layer atop the polysilicon gate electrode which inhibits the epitaxial growth of silicon on the polysilicon gate electrode. The nitrided surface layer is formed in the present invention by either implanting nitrogen-containing ions into the polysilicon gate electrode or by using a plasma nitridation process that incorporates nitrogen into the polysilicon gate electrode. Both of the above-mentioned techniques modify the top surface of the polysilicon gate electrode in such a manner that inhibits the growth of epitaxial silicon thereon.

Specifically, the method of the present invention comprises the steps of:

(a) forming a polysilicon layer atop a gate dielectric layer, said gate dielectric layer is formed on a surface of a semiconductor substrate;

(b) forming a nitrided surface layer on said polysilicon layer;

(c) selectively removing portions of said nitrided surface layer and said polysilicon layer stopping on said gate dielectric layer, while leaving a patterned stack of said nitrided surface layer and said polysilicon layer on said gate dielectric layer;

(d) forming sidewall spacers on at least exposed vertical sidewalls of said polysilicon layer not removed in step (c) as well as a portion of said gate dielectric layer;

(e) removing portions of said gate dielectric layer not protected by said sidewall spacers; and (f) growing an epi silicon layer on exposed horizontal surfaces of said semiconductor substrate, wherein said epi silicon layer is inhibited from growing on said polysilicon layer of said patterned stack due to the presence of said nitrided surface layer.

The present invention also includes the step of: (g) removing the nitrided surface layer from said polysilicon layer.

In one embodiment of the present invention, the nitrided surface layer is formed utilizing a nitrogen ion implantation process. In another embodiment of the present invention, the nitrided surface layer is formed utilizing a plasma nitridation process.

DETAILED DESCRIPTION OF THE INVENTION

Figure 1:
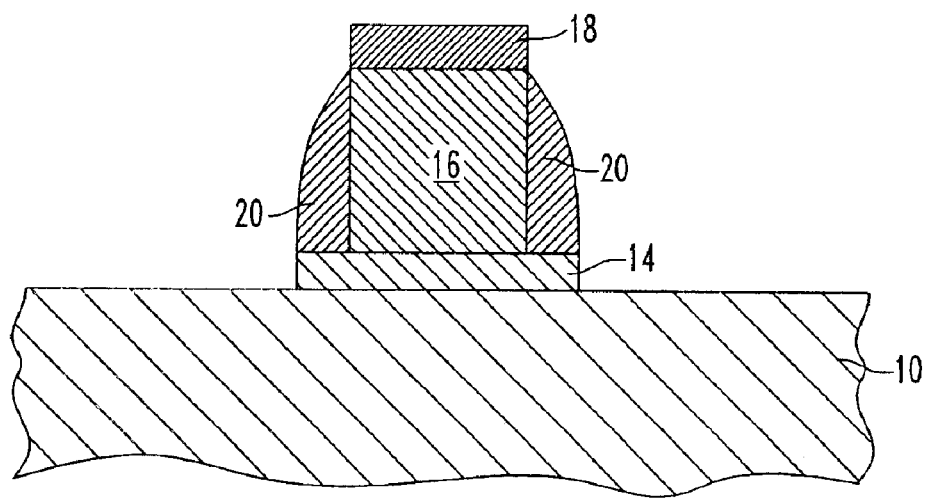
FIG. 1 is a pictorial representation (through a cross-sectional view) of a prior art CMOS device which includes a CVD oxide or nitride formed atop the gate polysilicon prior to growth of the epi silicon layer.

The present invention, which provides a method of forming a CMOS device having reduced contact resistance, will now be described in greater detail by referring to the drawings the accompany the present application. It is noted that in the accompanying drawings like and/or corresponding elements are referred to by like reference numerals.

Figure 2A:
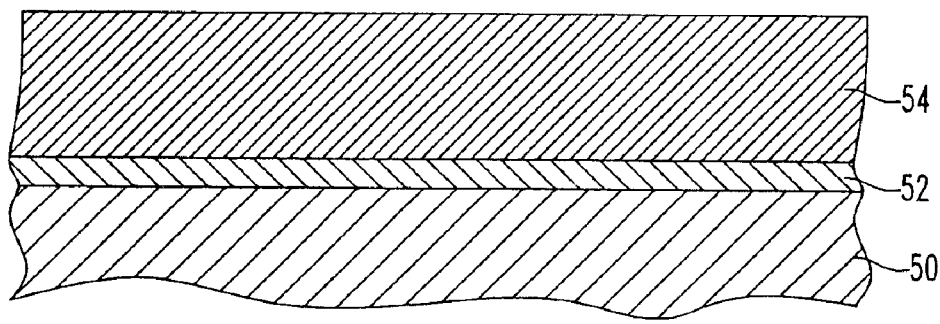
FIGS. 2A–2F are pictorial representations (through cross-sectional view) showing the various process steps employed in the present invention.

Referring first to FIG. 2A, there is shown an initial structure that can be employed in the present invention. Specifically, the initial structure shown in FIG. 1 includes semiconductor substrate 50, gate dielectric layer 52 formed on semiconductor substrate 50, and polysilicon layer 54 formed atop gate dielectric layer 52.

The initial structure shown in FIG. 2A is fabricated using conventional processing techniques well known in the art and the structure is composed of conventional materials that are also well known in the art. For example, semiconductor substrate 50 includes a silicon-on-insulator (SOI) substrate which comprises a buried oxide region sandwiched between a top Si-containing layer and a bottom Si-containing layer. For clarity the bottom Si-containing layer, buried oxide region and the top Si-containing layer are not specifically shown in the drawings, but are nevertheless meant to be included within substrate 50. The SOI substrate utilized in the present invention may be formed by conventional bonding and cutting processes or by a conventional separation by ion implantation of oxygen (SIMOX) process wherein oxygen ions are implanted into a Si-containing substrate and a high temperature annealing step (1100° C. or above) is used to convert the implanted oxygen ions into a buried oxide region.

In addition to SOI substrates, the present invention also contemplates the use of bulk semiconductor substrates. When a bulk substrate is employed, any semiconductor material including, but not limited to: Si, Ge, SiGe, GaAs, InAs, InP and all other III/V compound semiconductors may be employed in the present invention. The present invention also contemplates layered semiconductors such as Si/Si or Si/SiGe. The bulk semiconductor substrate may be of the n- or p-type depending on the desired device to be fabricated.

Additionally, semiconductor substrate 50 may contain active device regions, isolation regions or other like regions that are typically present in CMOS containing devices. For clarity, these regions are not shown in the drawings, but are nevertheless meant to be also included within region 50. In a highly preferred embodiment of the present invention, semiconductor substrate 50 is an SOI substrate.

Next, gate dielectric layer 52, which includes an oxide, nitride, oxynitride or any combination or multilayer thereof, is formed on a surface of semiconductor substrate 50 utilizing a conventional process well known in the art. For example, the layer of gate dielectric material may be formed utilizing a conventional deposition process such as chemical vapor deposition (CVD), plasma-assisted CVD, evaporation or chemical solution deposition, or alternatively the gate dielectric layer may be formed by a thermal growing process such as oxidation, nitridation or oxynitridation.

The thickness of gate dielectric layer 52 is not critical to the present invention, but typically gate dielectric layer 52 has a thickness of from about 1 to about 20 nm, with a thickness of from about 1.5 to about 10 nm being more highly preferred. It is noted that the gate dielectric material employed in the present invention may be a conventional dielectric material such as $SiO_2$ or $Si_3N_4$, or alternatively high-k dielectrics such as oxides of Ta, Zr, Hf, Al or combinations thereof may be employed. In one highly preferred embodiment of the present invention, gate dielectric layer 52 is comprised of an oxide such as $SiO_2$, $ZrO_2$, $HfO_2$, $Ta_2O_5$ or $Al_2O_3$.

After forming gate dielectric layer 52 on semiconductor substrate 50, polysilicon layer 54 is formed atop the gate dielectric layer. Note that the polysilicon layer will subsequently serve as the gate electrode of a metal oxide semiconductor field effect transistor (MOSFET) therefore the polysilicon layer should be a doped polysilicon layer. In accordance with the present invention, doping of the gate polysilicon may occur during deposition of the polysilicon layer utilizing a conventional in-situ doping deposition process; after deposition of the polysilicon layer, but prior to etching the gate stack; or after etching the gate stack. When an in-situ doping deposition process is not employed in the present invention, polysilicon layer 54 is formed by a conventional deposition process such as CVD or plasma-assisted CVD and ion implantation is employed in doping the polysilicon layer. Note that the doped polysilicon layer is subjected to a conventional activation annealing process either before or after the gate stack has been etched.

The thickness of polysilicon layer 54 is not critical to the present invention, but typically polysilicon layer 54 has a thickness of from about 100 to about 200 nm, with a thickness of from about 120 to about 180 nm being more highly preferred.

Figure 2B:
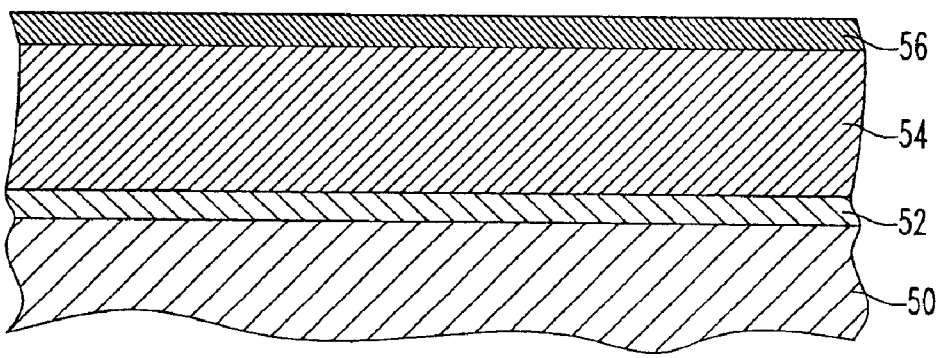

Next, and as shown in FIG. 2B, nitrided surface layer 56 is formed on polysilicon layer 54. Specifically, nitrided surface layer 56 is formed in the present invention by implanting nitrogen ions into the surface of the polysilicon layer; by utilizing a plasma nitridation process; or by utilizing any other technique that is capable of modifying the polysilicon layer by forming a nitrided surface layer thereon. Note that the nitrided surface layer is employed in the present invention as a means for inhibiting the growth of epi silicon on the patterned polysilicon gate electrode (to be subsequently formed).

When a nitrogen ion implantation process is employed in forming nitrided surface layer 56, a nitrogen-containing ion source material, such as $N_2$, NO, $N_2O$, $NH_3$ and mixtures thereof, is employed and the nitrogen ions from the source material are implanted into the polysilicon layer utilizing anion dosage of from about 1E14 to about 1E15 atoms/cm$^2$ and an energy of from about 1 to about 5 Kev. This implant causes portions of the polysilicon layer to become nitrogen rich, yet the implant does not form a continuous layer of stoichiometric silicon nitride film. When selective epi silicon is grown in a subsequent processing step, the nitrogen rich surface retards the nucleation of the silicon and thus causes little or no silicon epi growth on the polysilicon gate electrode.

It is noted that other species and ion implantation conditions besides those mentioned above that are capable of forming a nitrided surface layer that retards epi silicon growth can be employed in the present invention. For example, the present invention also contemplates nitrogen ion implantation processes wherein the nitrogen-containing ion source material is admixed with an inert gas such as He, Ar, Ne, Kr or Xe. In another embodiment where a plasma nitridation process is employed, the nitridation is carried out at a temperature of about 1100° C. or below in a nitrogen-containing atmosphere such as $N_2$, NO, $N_2O$, and $NH_3$. Mixtures of the aforementioned nitrogen-containing atmospheres are also contemplated herein. The present invention also contemplates plasma nitridation processes wherein the nitrogen-containing gas is admixed with an inert gas such as He, Ar, Ne, Kr or Xe. More specifically, the plasma nitridation process is carried out at a temperature of from about 1000° to about 1100° C.

It is noted that the nitrogen species used in this embodiment of the present invention will form ions that react with the silicon surface and form a nitrogen rich surface layer on the polysilicon layer. As was the case with the nitrogen ion implantation embodiment, the plasma nitridation process does not form a continuous silicon nitride layer, but instead forms a nitrided surface layer on the polysilicon layer that will inhibit the growth of epi silicon layer.

The plasma nitridation process may be carried out using furnace heating conditions wherein longer nitridation times (on the order of from about 4 hours or greater) are employed, or the plasma nitridation process may be carried out using rapid thermal conditions wherein shorter heating times (on the order of about 120 seconds or less) are employed. Hence, the present invention contemplates rapid thermal (RT) nitridation processes such as RTNH, RTNO, RTNO$_2$, rapid plasma nitridation (RPM) or a decoupled plasma nitridation (DPN) process as well as conventional furnace plasma nitridation processes.

Notwithstanding which technique is employed in forming the nitrided surface layer, the nitrided surface layer formed has a thickness of from about 0.8 to about 2 nm, with a thickness of from about 1.0 to about 1.5 nm being more highly preferred.

After forming nitrided surface layer 56 on polysilicon layer 54, nitrided surface layer 56 and polysilicon layer 54 are patterned utilizing conventional lithography and etching so as to form at least one patterned stack region 58 (includes patterned nitride surface layer 56 and patterned polysilicon layer 54) on gate dielectric layer 52; See FIG. 2C It is emphasized that although the drawings show the formation of only one patterned stack region, the present invention works equally well when a plurality of patterned stack regions are formed on the gate dielectric layer.

Patterned stack region 58, which includes patterned nitrided surface layer 56 and patterned polysilicon layer 54, is formed by first applying a photoresist (not shown in the drawings) to a surface of nitrided surface layer 56, exposing said photoresist to a pattern of radiation and developing the pattern using a conventional resist developer. In some embodiments of the present invention, a hardmask such as a layer of tetraethylorthosilicate (TEOS) is formed on the nitrided surface layer prior to resist application, exposure and development. In such an embodiment, the stack region would include a patterned layer of harkmask material atop the patterned nitrided surface layer.

After developing the resist, a conventional dry etching process such as reactive ion etching, plasma etching, ion beam etching or laser ablation is employed in transferring the resist pattern to the underlying nitrided surface layer and polysilicon layer. Note that the etching process utilized during this step of the present invention selectively removes portions of the nitrided surface layer and polysilicon layer that are not protected by the patterned resist, while leaving other portions of the nitrided surface layer and the polysilicon layer protected by the patterned resist on the surface of gate dielectric layer 52.

Figure 2C:
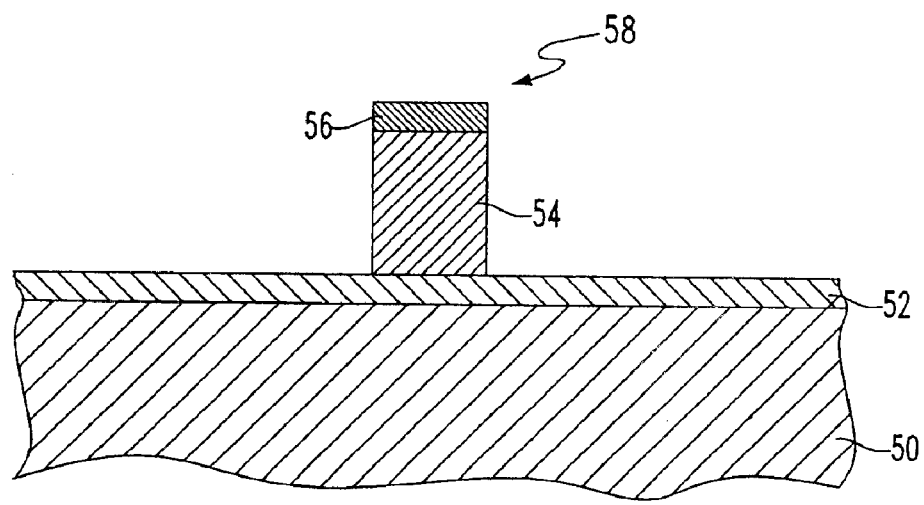

Following the etching process, the patterned photoresist is removed from the structure utilizing a conventional stripping process well known in the art so as to provide the structure shown, for example, in FIG. 2C.

Figure 2D:
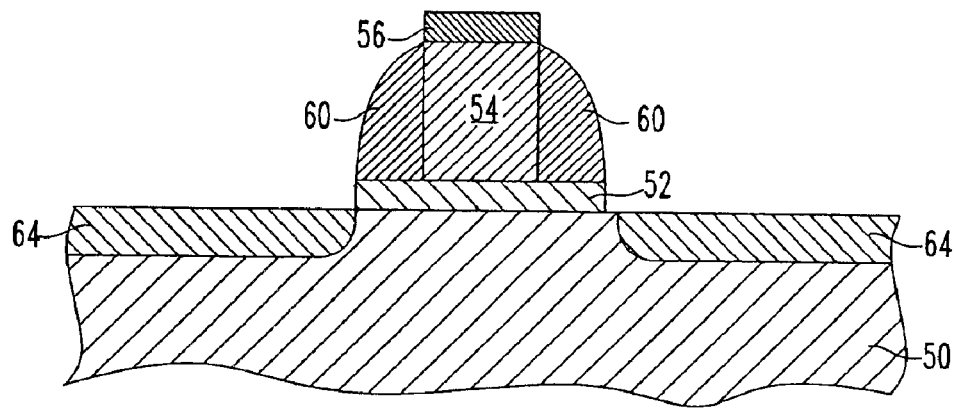

FIG. 2D shows the resultant structure after forming sidewall spacers 60 on vertical surfaces of the stack region (including at least patterned polysilicon layer 54) as well as on a portion of gate dielectric layer 52 and etching gate dielectric layer 52 that is not protected by either the sidewall spacers or the patterned stack region.

The sidewall spacers, which may be composed of an oxide, nitride, oxynitride or combinations and multilayers thereof, are formed utilizing a conventional process well known to those skilled in the art. For example, sidewall spacers 60 are formed by deposition and etching. A highly preferred material for sidewall spacers 60 is a nitride such as $Si_3N_4$.

Following formation of the sidewall spacers, a conventional etching process such as a diluted HF dipping process is used to remove the exposed portions of gate dielectric layer 52 from the structure. Note that a portion of the uppermost surface of semiconductor substrate 50 is exposed following the removal of portions of the gate dielectric layer therefrom.

At this point of the present invention, source/drain diffusion regions 64 are formed into the surface of semiconductor substrate as shown in FIG. 2D. The source/drain regions are formed utilizing conventional processes well known in the art, including ion implantation and activation annealing. Note that in some embodiments of the present invention, the source/drain regions are formed in the substrate prior to formation of the gate dielectric layer thereon.

Figure 2E:
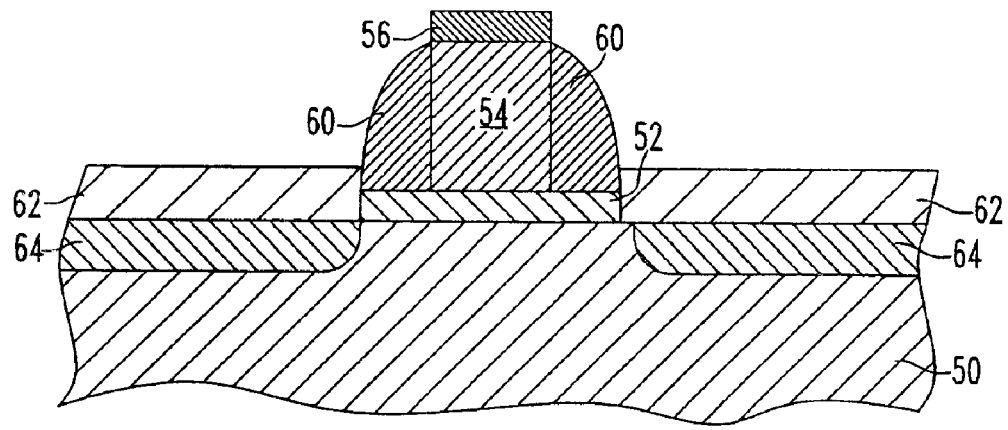

Next, and as shown in FIG. 2E, epi silicon layer 62 is formed on exposed horizontal surfaces of the structure that do not include the nitrided surface layer. Note that the presence of the nitrided surface layer on the patterned polysilicon gate electrode inhibits the growth of epi silicon layer 62 thereon. The epi silicon layer is formed utilizing a conventional epitaxial silicon growing process well known in the art. Specifically, the selective epi silicon growth process comprises the use of a silicon-containing source material such as a silane which is deposited at a temperature of about 800° C. or above.

The thickness of the epi silicon layer formed at this point of the present invention is not critical to the present invention, but typically epi silicon layer 62 has a thickness of from about 20 to about 40 nm, with a thickness of from about 25 to about 30 nm being more highly preferred.

Figure 2F:
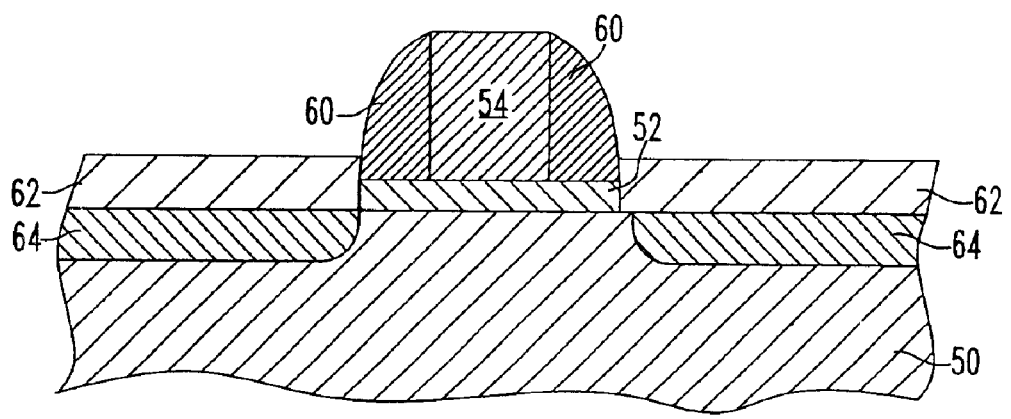

FIG. 2F shows the structure that is formed after nitrided surface layer 56 has been removed from atop the patterned polysilicon gate electrode, i.e., patterned polysilicon layer 54. The nitrided surface layer is removed from atop the patterned polysilicon gate electrode utilizing a conventional dipping, coating or brushing process wherein a chemical etchant that has a high selectively for removing the nitrided surface layer is employed. For example, HF can be employed in removing the nitrided surface layer from atop the patterned polysilicon layer. In embodiments wherein a hardmask is present on the patterned nitrided surface layer, the hardmask is removed first using a conventional etching process well known in the art and thereafter patterned nitrided surface layer 56 is removed, as indicated above.

Following the removal of the nitrided surface layer, conventional CMOS processes steps are performed on the structure shown in FIG. 2F. For example, processing steps which form metal silicide contacts on the source and drain regions as well as gate electrodes can be employed in the present invention. Also, processing steps that lead to connecting the metal silicide contacts to external wires can be employed in the present invention as well.

A key advantage of the inventive method is that the surface treatment can be performed on only part of the semiconductor substrate, leaving some of the polysilicon untreated. This cases allows certain gate electrodes to grow selective epi thereon, while others that receive the nitrided surface layer do not contain selective epi thereon. This aspect of the present invention could be useful in specific device applications where a thicker polysilicon in certain regions could provide a lower resistance.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of preventing the growth of an epitaxial silicon layer on a surface of a polysilicon gate electrode, said method comprising the steps of:
    (a) forming a polysilicon layer atop a gate dielectric layer, said gate dielectric layer being formed on a surface of a semiconductor substrate;
    (b) forming a nitrided surface layer by modifying a surface portion of said polysilicon layer wherein said nitrided surface layer is formed by a plasma nitridation process carried out at a temperature of from about 1000° C.–1100° C.;
    (c) selectively removing portions of said nitrided surface layer and said polysilicon layer stopping on said gate dielectric layer, while leaving a patterned stack of said nitrided surface layer and said polysilicon layer on said gate dielectric layer;
    (d) forming sidewall spacers on at least exposed vertical sidewalls of said polysilicon layer not removed in step (c) as well as a portion of said gate dielectric layer;
    (e) removing portions of said gate dielectric layer not protected by said sidewall spacers; and
    (f) growing an epitaxial silicon layer on exposed horizontal surfaces of said semiconductor substrate, wherein said epitaxial silicon layer is inhibited from growing on said polysilicon layer of said patterned stack due to the presence of said nitrided surface layer.

2. The method of claim 1 wherein said semiconductor substrate comprises a bulk semiconductor or a silicon-on-insulator.

3. The method of claim 1 wherein said gate dielectric layer is comprised of an oxide, a nitride, an oxynitride, or combinations and multilayers thereof.

4. The method of claim 3 wherein said gate dielectric layer is comprised of an oxide, said oxide being selected from the group consisting of $SiO_2$, $ZrO_2$, $HfO_2$, $Ta_2O_5$ and $Al_2O_3$.

5. The method of claim 1 wherein said gate dielectric layer is formed by a deposition process or a thermal growing process.

6. The method of claim 1 wherein said polysilicon layer is formed by an in-situ doping deposition process or deposition followed by ion implantation.

7. The method of claim 1 wherein said plasma nitridation process is performed in the presence of a nitrogen-containing atmosphere.

8. The method of claim 7 wherein said nitrogen-containing atmosphere comprises $N_2$, $NH_3$, NO, $N_2O$ or mixtures thereof.

9. The method of claim 7 wherein said nitrogen-containing atmosphere is admixed with an inert gas.

10. The method of claim 1 wherein said plasma nitridation process is a rapid thermal nitridation process which is carried out for a time period of about 120 seconds or less.

11. The method of claim 1 wherein step (c) includes lithography and etching.

12. The method of claim 11 wherein said etching comprises a dry etching process selected from the group consisting of reactive ion etching, plasma etching, ion beam etching and laser ablation.

13. The method of claim 1 wherein said sidewall spacers are formed by deposition and etching.

14. The method of claim 1 wherein step (e) comprises a diluted HF etching process.

15. The method of claim 1 wherein step (f) comprises a selective epitaxial silicon growing process, wherein a silicon source material is deposited at temperature of about 800° C. or above.

16. The method of claim 1 further comprising the step of (g) removing the nitrided surface layer from atop said polysilicon later.

17. The method of claim 16 wherein said nitrided surface layer is removed by dipping into a solution containing HF.

* * * * *